(12) United States Patent
Shaalan et al.

(10) Patent No.: US 11,242,595 B1
(45) Date of Patent: Feb. 8, 2022

(54) METHOD OF MAKING METAL NANOSTRUCTURES USING LOW TEMPERATURE DEPOSITION

(71) Applicant: KING FAISAL UNIVERSITY, Al-Ahsa (SA)

(72) Inventors: Nagih Mohammed Shaalan, Al-Ahsa (SA); Faheem Ahmed, Al-Ahsa (SA); Osama Sabera, Al-Ahsa (SA); Dalia Hamad, Al-Ahsa (SA); Abdullah Aljaafari, Al-Ahsa (SA); Adil Alshoaibi, Al-Ahsa (SA)

(73) Assignee: KING FAISAL UNIVERSITY, Al-Ahsa (SA)

( * ) Notice: Subject to any disclaimer, the term of this patent is extended or adjusted under 35 U.S.C. 154(b) by 0 days.

(21) Appl. No.: 17/221,786

(22) Filed: Apr. 3, 2021

(51) Int. Cl.
| | |
|---|---|
| C23C 14/24 | (2006.01) |
| C23C 14/16 | (2006.01) |
| C23C 14/26 | (2006.01) |
| C23C 14/54 | (2006.01) |
| B82Y 30/00 | (2011.01) |
| B82Y 40/00 | (2011.01) |

(52) U.S. Cl.
CPC ............ *C23C 14/243* (2013.01); *C23C 14/16* (2013.01); *C23C 14/26* (2013.01); *C23C 14/54* (2013.01); *B82Y 30/00* (2013.01); *B82Y 40/00* (2013.01)

(58) Field of Classification Search
CPC ....... C23C 14/243; C23C 14/16; C23C 14/26; C23C 14/54
See application file for complete search history.

(56) References Cited

U.S. PATENT DOCUMENTS

| | | | |
|---|---|---|---|
| 4,054,500 A | | 10/1977 | Parent |
| 5,584,935 A | * | 12/1996 | Green ................. C23C 14/08 118/726 |
| 2016/0002749 A1 | | 1/2016 | Yagi |
| 2020/0080188 A1 | * | 3/2020 | Zhang ................. C23C 14/22 |

FOREIGN PATENT DOCUMENTS

| | | |
|---|---|---|
| JP | H04-372933 A | 12/1992 |
| JP | H05-291183 A | 11/1993 |
| JP | H07-65372 A | 3/1995 |
| JP | H10-308358 A | 11/1998 |
| JP | 2003-317955 A | 11/2003 |

OTHER PUBLICATIONS

Alhalaili et al. Gallium oxide nanowires for UV detection with enhanced growth and material properties, Scientific Reports, Nature Research (2020) p. 1-14. (Year: 2020).*
"Crucible Heaters;" © 2020 Angstrom® Engineering Inc. https://angstromengineering.com/tech/resistive-thermal-evaporation/crucible-heaters/.

* cited by examiner

*Primary Examiner* — Kelly M Gambetta
(74) *Attorney, Agent, or Firm* — Nath, Goldberg & Meyer; Richard C. Litman

(57) ABSTRACT

A method of forming metal nanostructures is a low temperature closed space vacuum deposition method. The method includes disposing a source material in an enclosed space at low evaporation temperatures to controllably form nanostructures of different dimensionalities on a substrate. The nanostructures have dimensionalities determined by a chosen evaporation temperature. An apparatus is also provided for performing the method.

14 Claims, 7 Drawing Sheets

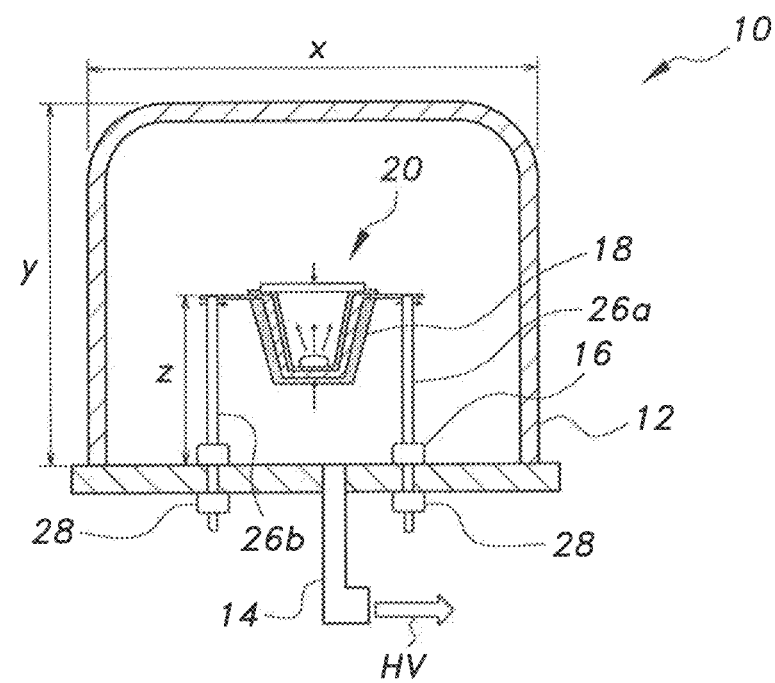
FIG. 1A
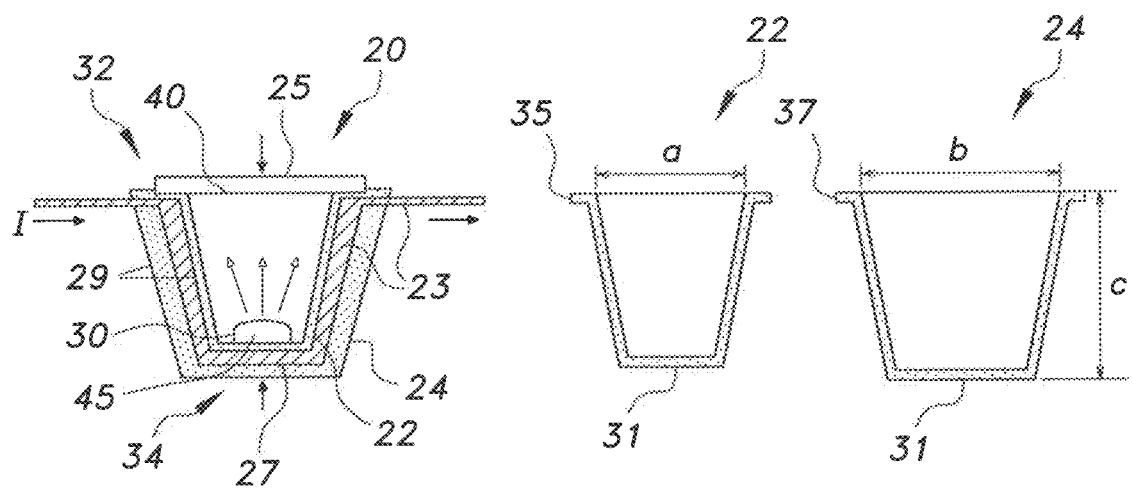
FIG. 1B  FIG. 1C  FIG. 1D

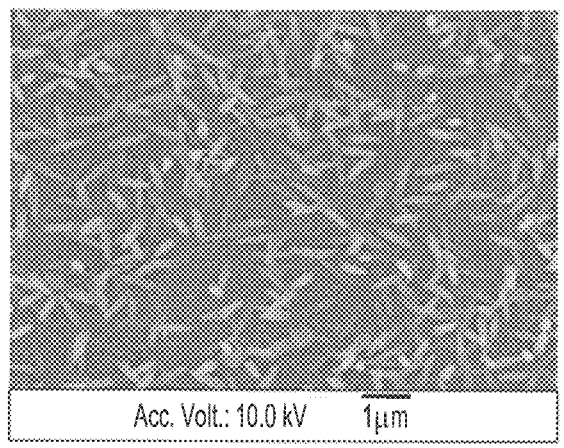
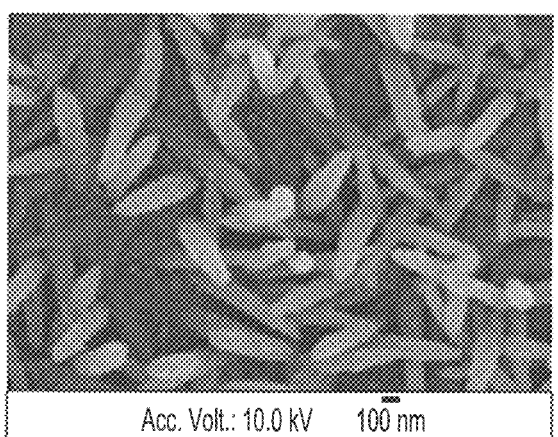
FIG. 8A　　　　　　　　FIG. 8B
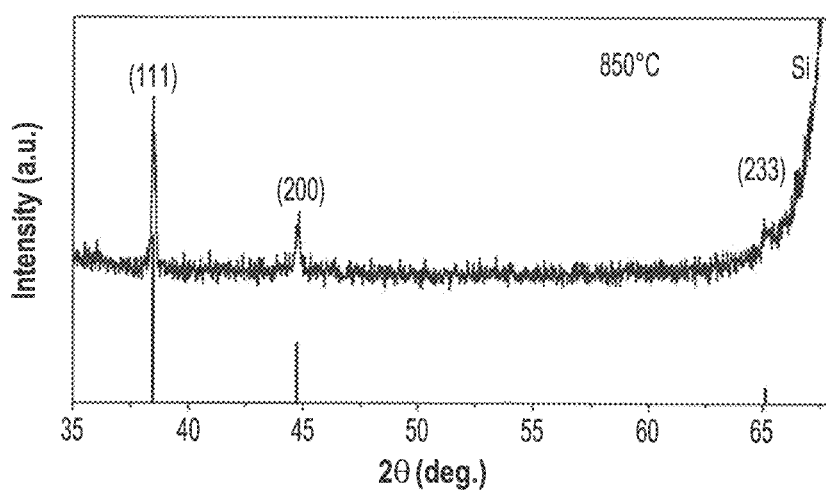
FIG. 9

METHOD OF MAKING METAL NANOSTRUCTURES USING LOW TEMPERATURE DEPOSITION

BACKGROUND

1. Field

The disclosure of the present patent application relates to a method and apparatus useful for making nanostructures, and particularly, to a method and apparatus for making a variety of nanostructures using low temperature closed space vacuum deposition.

2. Description of the Related Art

Metal nanostructures are ubiquitous in basic research and industry. For example, metal nanostructures have been useful in catalysis, sensing, surface-enhanced Raman scattering (SERS), near-infrared photothermal therapy and surface functionalization of various materials.

The properties and function of metal nanostructures are closely correlated with their size, shape, structure and composition. Controlled and consistent synthesis of metal nanostructures for various applications can be energetically and economically costly.

Thus, a method for forming various metal nanostructures using low-temperature vapor deposition and an apparatus for performing said method solving the aforementioned problems are desired.

SUMMARY

An apparatus for making metal nanostructures includes a vacuum chamber and a growth system enclosed within the chamber. The growth system includes a double crucible container and a pair of rods supporting the double crucible container above a bottom surface of the vacuum chamber. The rods can be secured to respective insulators on the chamber floor.

The double crucible container can include an inner crucible, an outer crucible, and a heating element extending between the inner and outer crucibles. Each of the crucibles include a bottom wall, an upright peripheral wall extending from the bottom wall, and an open top end. An upper edge of the inner crucible is bent back, forming a first lip. An upper edge of the outer crucible is also bent back, forming a second lip. A top end of the heating element is also bent and extends beyond the inner and outer crucibles, between the first and second lips. A substrate can be disposed over the open end of the crucibles. A top thermocouple can be disposed over the substrate.

A method for forming nanostructures includes placing an amount of source material in the growth system. The source material can be disposed within a cavity of the inner crucible and the substrate can be disposed over the opening of the inner crucible to form a seal with the lip structure of the inner crucible. A vacuum can be applied towards the growth apparatus within the vacuum chamber and the temperature of the source material can be raised to an evaporation temperature ranging from about 800° C. to about 1350° C. The temperature of the source material can be maintained at the evaporation temperature for a period of time. The source material can be allowed to cool to room temperature and the vacuum can be released. The nanostructures can be deposited on the substrate and take a form depending on the evaporation temperature chosen, e.g., the substrate temperature relative to the melting temperature of the source material chosen.

These and other features of the present subject matter will become readily apparent upon further review of the following specification.

BRIEF DESCRIPTION OF THE DRAWINGS

FIGS. 1A-1D depict (1A) an embodiment of the apparatus for making metal nanostructures 10: (1B) the double crucible container 20; (1C) the inner crucible 22; (1D) the outer crucible.

FIGS. 8A-8B depict SEM images of aluminum nanostructures prepared at a temperature of 850° C. and vacuum of $10^{-5}$ mbar according to the present application.

FIG. 9 depicts X-ray diffraction (XRD) results of gold nanostructures prepared at 850° C. (as prepared and shown in FIGS. 8A-8B) and vacuum of $10^{-5}$ mbar.

Similar reference characters denote corresponding features consistently throughout the attached drawings.

DETAILED DESCRIPTION OF THE PREFERRED EMBODIMENTS

Figure 2:
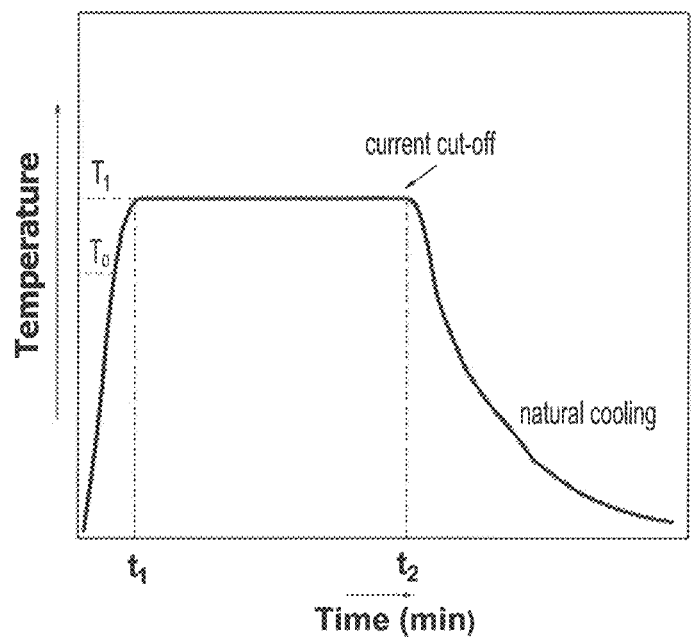
FIG. 2 is a graph depicting a typical heating regime for preparing nanostructures by the present apparatus ($T_1$ is the deposition temperature, $T_0$ is an initial temperature before $T_1$ is reached at which some deposition may begin, particularly in the case of 1-D nanostructure deposition-$T_0$ may not apply for all materials applicable).

FIGS. 1A-1D illustrate an apparatus for making metal nanostructures 10. The apparatus for making metal nanostructures 10 includes a vacuum chamber 12 and a growth system 20 with a double crucible container 18 within the chamber 12. A pair of rods 26a, 26b support the double crucible container 18 above a bottom surface of the vacuum chamber 12. The rods 26a, 26b can be secured to respective insulators 28 on the chamber floor. A vacuum conduit 14 extends into the vacuum chamber 12.

The double crucible container 20 can include an inner crucible 22, an outer crucible 24, and a heating element 23 extending between the inner and outer crucibles 22, 24. Each of the crucibles 22, 24 include a bottom wall 31, an upright peripheral wall 29 extending from the bottom wall 31, and an open top end. An upper edge of the inner crucible 22 is bent back, forming a first lip 35. An upper edge of the outer crucible is also bent back, forming a second lip 37. A top end of the heating element 23 extends beyond the inner and outer crucibles 22, 24, between the first and second lips, 35, 37. A substrate 40 can be placed over the open end of the inner crucible 22 and a top thermocouple 25 can be placed over the substrate 40. A source material 45 can be disposed within a cavity of the inner crucible, as illustrated in FIG. 1B. A bottom thermocouple 27 can be disposed under the source material 45.

The inner crucible and outer crucible can be made from materials having high thermal conductivity, compressive strength, thermal shock resistance; and low thermal expansion and reactivity. Suitable materials may include, for example, ceramics and alumina. In a particular embodiment, the inner crucible and outer crucible each include alumina. The inner crucible can be smooth. The heating element can be in direct contact with the outer surface of the inner crucible and an inner surface of the outer crucible. In an embodiment, the rods are stainless steel rods.

The inner crucible and outer crucible can have any suitable shape, such as barrel-shaped, conical-shaped, and cylindrical-shaped. Barrel-shaped crucibles can have an open end with a top diameter that is essentially the same as or only slightly smaller than the diameter of the bottom wall. The peripheral walls can bulge out, producing a barrel shaped crucible. Conical or tapered crucibles can have an opening with a diameter that is larger than a diameter of the bottom wall and a cone-shaped peripheral wall (as illustrated in FIGS. 1A-1B). Cylindrical or straight walled crucibles can have an opening with a diameter that is essentially the same as or only slightly smaller than the diameter of the bottom wall and straight side walls. The crucibles can have other shapes, such as low, shallow or flat profiles with short peripheral walls. In a particular embodiment, the inner crucible and outer crucible are each conical in shape (as in FIG. 1B). In a particular embodiment, the inner and outer crucibles are conical. In such an embodiment, a diameter (a) of the opening formed by the inner crucible ranges from about 5 mm to about 20 mm, from about 8 mm to about 15 mm, or from about 9 mm to about 10 mm. In particular, the diameter of the opening may be 9 mm. The height from a bottom wall of the inner crucible to the opening of the inner crucible may be from about 5 mm to about 30 mm, about 10 mm to about 25 mm, or about 15 mm to about 20 mm. A diameter (b) of the opening of the outer crucible can be about 18 mm. A height (c) of the outer crucible can be about 20 mm. The cavity defined within the peripheral wall of the inner crucible can range from about 0.25 cm$^3$ to about 4 cm$^3$, from about 0.5 cm$^3$ to about 2 cm$^3$, or from about 0.75 cm$^3$ to about 1 cm$^3$.

The substrate may be chosen according to the ultimate application for which the metal nanostructures are being made. For example, the substrate may be silicon, glass or quartz. In an embodiment, the substrate is a silicon substrate, such as a silicon wafer. The substrate can be of a shape and size capable of completely covering the opening of the inner crucible forming a seal with the lip of the inner crucible. The substrate may comprise a semiconducting material, in an embodiment.

The heating element can be a resistive wire or similar element. The heating element may be disposed around an outer surface of the inner crucible. In a particular embodiment, the heating element is a tungsten wire. The heating element can be connected to a power source for applying a voltage across the heating element.

The top thermocouple can be attached to the outer surface of the substrate and a bottom thermocouple can be attached to a bottom of the outer crucible. The top thermocouple can determine a temperature of the substrate and the bottom thermocouple can determine a temperature of the source material.

The vacuum chamber can be connected to a high-vacuum system capable of achieving a vacuum pressure of $10^{-4}$-$10^{-6}$ mbar, e.g., $10^{-5}$ mbar. The vacuum chamber may be approximately an order of magnitude larger than the double crucible container in linear scale. For example, a height (y) of the vacuum chamber can be about 25 cm and a width (x) of the vacuum chamber can be about 20 cm. The power source may be external to and electrically isolated from the vacuum chamber.

A method for forming nanostructures can include low temperature closed space vacuum vapor deposition (LT-CSVVD). The method can include placing an amount of source material in the cavity of the inner crucible. The source material can be in solid form, for example, in the form of a powder or grain. The source material may have an average size that is less than about 2.0 mm, for example, an average size ranging from about 0.5 mm to about 1.0 mm. The amount of source material may vary, ranging from about 3 mg to about 15 mg. About 3 mg to about 5 mg of the source material can be disposed in the cavity to form a nanostructure film. About 10 mg to about 15 mg of the source material can be disposed in the cavity to form nanostructures in thick film or powder form. The growth apparatus can be closed by placing the substrate on the lip of the inner crucible.

The substrate can be rinsed and dried before covering the container. For example, the substrate can be rinsed with the following solvents in order: distilled water, ethanol, distilled water, ethanol, semiconductor detergent, and ethanol. The substrate may be dried by any known means, such as by air evaporation.

Once the growth system is disposed in the high vacuum chamber, the heating element can be connected with the power source and a high vacuum can be applied. The high vacuum can range from about $10^{-4}$ mbar to about $10^{-6}$ mbar, e.g., $10^{-5}$ mbar. A temperature of the source material can be raised to an evaporation temperature of 850° C.-1350° C., depending on the desired nanostructure to be grown (FIG. 3). The evaporation temperature can be ramped up over a period of time, ranging from about 1 min to about 20 min, or about 2 min to about 10 min, or about 3 min to about 5 min. The substrate can be maintained at the evaporation temperature for a predetermined time, e.g., about 30 min. to about 90 min. After the predetermined time, the power source can be turned off and the temperature can be allowed to cool naturally over time (see FIG. 2). The high vacuum can then be released and the chamber can be allowed to vent to 1 atm. The substrate can be removed from the growth apparatus. The substrate can include a thin layer of nanostructures, a thick layer of nanostructures, or a nanostructure powder, depending on the amount of source material used.

Figure 3:
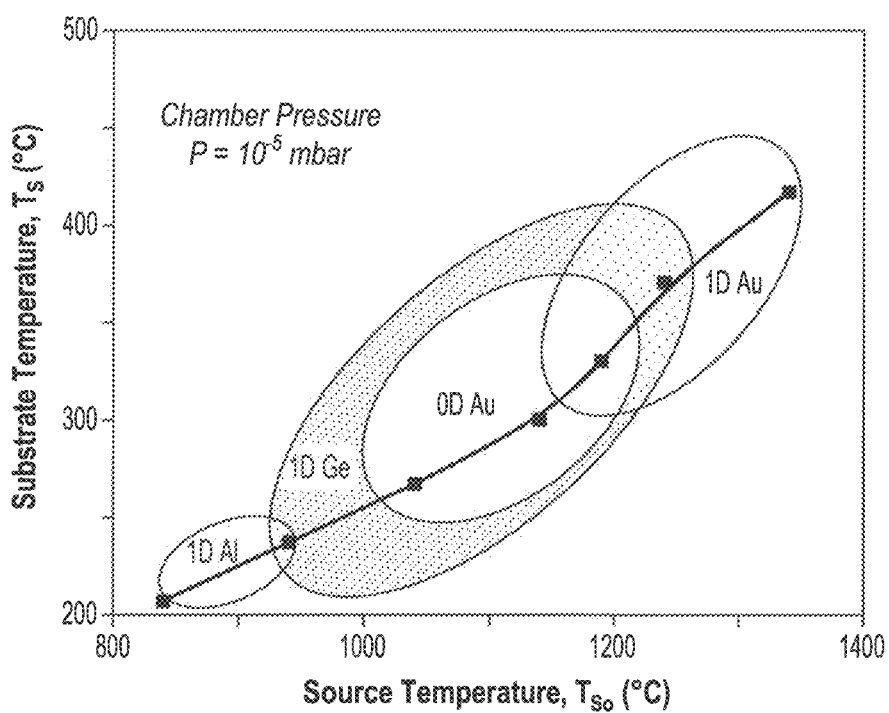
FIG. 3 is a graph illustrating a relation between nanostructure type for various materials and substrate and evaporation temperature.
Figure 4A:
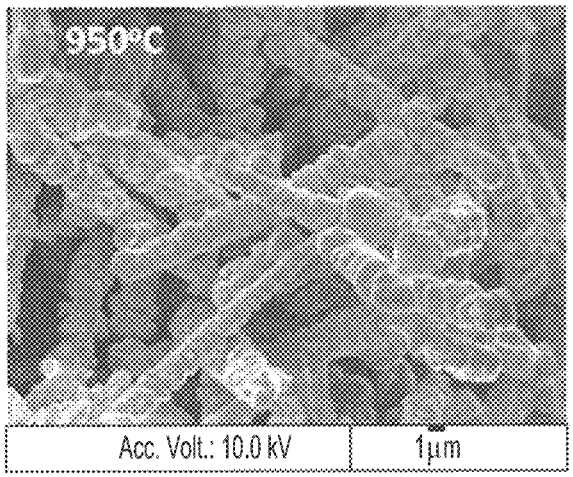
FIGS. 4A-4D depict scanning electron microscopy (SEM) images of germanium nanostructures prepared at 4(A) 950° C.; 4(B) 1050° C.; 4(C) 1250° C. and vacuum of $10^{-5}$ mbar; and 4(D) depicts a portion of FIG. 4C according to the present application.
Figure 4B:
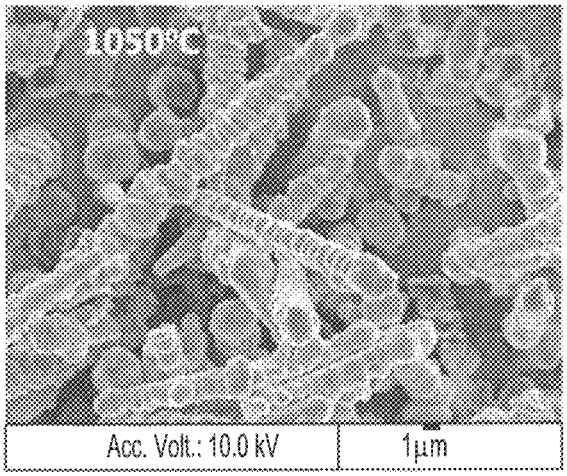
Figure 4C:
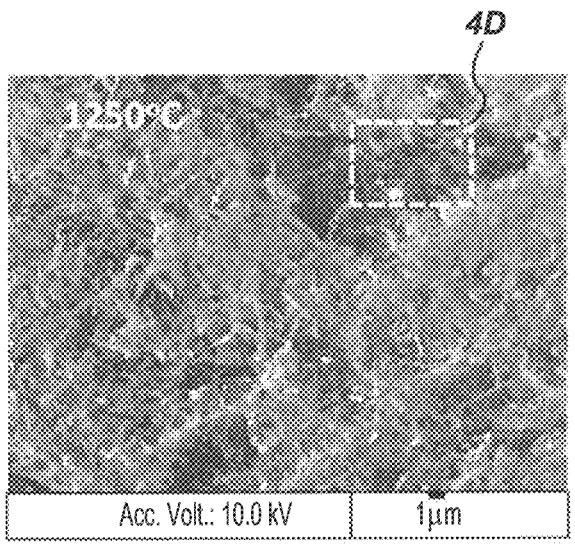
Figure 4D:
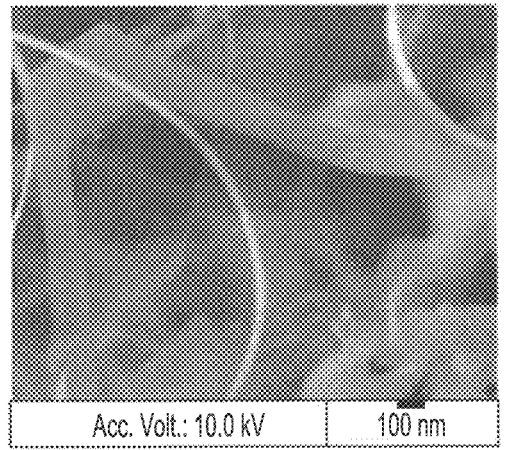

FIG. 2 shows the regime of nanostructures growth in the present method. $T_0$ represents a temperature at which nanostructures may begin to form before the final evaporation temperature, $T_1$, is reached. This temperature $T_0$ may be equal to $T_1$ in some cases. Nanostructures formed at a $T_0 < T_1$ may act as nucleation for nanostructure growth at $T_1$. This is believed to be relevant in the growth of one-dimensional nanostructures.

The term nanostructures, as used herein, refers to materials having a dimension of a nanoscale range, which may be from 1 to 999 nm. e.g., 1.100 nm. Nanostructures include, for example, zero dimensional (0D) nanostructures, i.e., nanoparticles; one dimensional (1D) nanostructures, i.e., nanowires or nanotubes; and two dimensional (2D) nanostructures, i.e., nanosheets or nanoflakes For example, a nanosheet is a nanostructure with at least one nanoscale dimension (thickness). A nanoparticle is a nanostructure with all three dimensions being nanoscale.

The amounts of materials for the methods described herein are exemplary, and appropriate scaling of the amounts are encompassed by the present subject matter, as long as the relative ratios of materials are maintained. As used herein, the term "about," when used to modify a numerical value, means within ten percent of that numerical value. The following examples illustrate the present teachings.

EXAMPLES

Example 1

Exemplary Apparatus for Present Method

FIGS. 1A-1B illustrate an exemplary apparatus prepared according to the present teachings. The inner crucible and outer crucible were made of alumina and were conical in shape. The inner crucible was 20 mm in height and had a circular opening at the top that was 9 mm in diameter. The outer crucible was 20 mm in height and had a circular opening at the top that was 18 mm in diameter. The heating element was a tungsten wire wound around the entire outer surface of the inner crucible. In an embodiment, the wire was well protected by the outer alumina, as shown in FIG. 1B. The top thermocouple was a type K thermocouple and the bottom thermocouple was a type R thermocouple. The double crucible container was suspended on stainless steel pillars that were secured to insulators and placed in the vacuum chamber. The vacuum chamber was 25 cm in height and 20 cm in diameter, and was connected to a high vacuum system, as shown in FIG. 1A.

Example 2

Demonstration of Present Method for Making Metal Nanostructures 3 mg-15 mg of the source material (in the form of grain or powder, 0.5 mm-1.0 mm in diameter) was placed in the bottom of the growth apparatus of Example 1, as shown in FIGS. 1A-1B. A silicon substrate was cleaned by rinsing with distilled water, ethanol, distilled water, ethanol, semiconductor detergent and ethanol, in order, then air dried. The silicon substrate was placed on the double crucible container to completely cover the opening of the inner crucible and form a seal with the lip. The double crucible container was placed in the high vacuum chamber, connected to the electrical terminals and suspended on stainless steel pillars electrically insulated from the high vacuum chamber. The vacuum chamber was evacuated to a pressure of $10^{-5}$ mbar. The temperature was raised to the particular temperature presented in the following examples over a time of 3 min-5 min. The temperature was maintained for 30 min-90 minutes, as specified in the following examples. The system was then allowed to cool to room temperature with vacuum maintained. The vacuum chamber was vented to 1 atm after room temperature was reached. The silicon substrate with nanostructures deposited thereon was removed from the growth apparatus. The nanostructures were deposited as a thin film or a thick layer or powder (i.e., easily removed by scratching) depending on the original amount of source material provided. FIG. 2 shows the regime of the nanostructure growth during the present method.

Example 3

Nanostructures Prepared by the Present Methods

The surface morphology of the nanostructures prepared according to the present method was observed with a field emission scanning electron microscope (FE-SEM) (JEOL JSM-6700F). Samples for FESEM analysis were prepared over an area of 3×3 mm$^2$. X-ray diffraction (XRD) data were collected using an x-ray diffractometer (Shimadzu XRD-6100) with Cu-Kα radiation. The measurements ranged from 2θ=10° to 2θ=65° with a scanning speed of 0.02°/sec at 40 kV and 30 mA. The incident wavelength was 1.54060 Å, and I/Io was 0.5. Crystallographic structure analysis of nanomaterials was investigated by a crystallographic Rietveld program.

The evaporation temperature of the source materials ($T_{so}$) and the temperature of the substrate ($T_s$) were critical for the growth of the nanostructures. The evaporation temperature was changed from 850° C. up to 1350° C., which alone caused a change in the obtained nanostructure dimensions. At low temperature, zero-dimensional nanostructure, such as nanoparticles, were grown. At higher temperature, one-dimensional nanostructures, such as nanowires, were grown.

FIG. 3 shows a figure of merit for the relation between nanostructure type for various materials and substrate and evaporation temperature growth of 0D and 1D nanostructures as a function of source and substrate temperature for Al, Ge and Au nanostructures. The source temperature of Au was changed from 1150° C. up to 1350° C. corresponding to 280° C. to 450° C. of substrate temperature, which was suitable for the growth of nanostructures. In case of Al, the source temperature was as low as 850° C. The evaporation temperature of 1D Ge nanostructures changed from 950° C. up to 1250° C., which can be protracted for nanoparticles at lower temperatures.

As an initial example, Ge nanostructures were prepared according to the conditions of Table 1, resulting in the structures shown in FIGS. 4A-4D. The deposition was carried out at temperatures ranging from 950° C. to 1250° C. and vacuum of $10^{-5}$ mbar. At a temperature of 950° C., the resulting nanorods are observed to be on average 12 μm in length and 0.5-1 μm in diameter. Similar structures were observed when prepared at temperatures of 1050° C. At a temperature of 1250° C., nanowires 30-200 nm in diameter were observed.

TABLE 1

| Ge preparation conditions | | | | | | |
|---|---|---|---|---|---|---|
| Source temp (°C.) | Substrate temp (°C.) | Pressure (mbar) | Time (min) | Source amount (mg) | Morphology | Size (nm) |
| 950 | 240 | $10^{-5}$ | 30 | 10 | NRs | 500-1000 |
| 1050 | 270 | | | | NRs | 500-1000 |
| 1250 | 380 | | | | NWs | 30-200 |

NRs: nanorods, NWS: nanowires, NPs: nanoparticles

Figure 5:
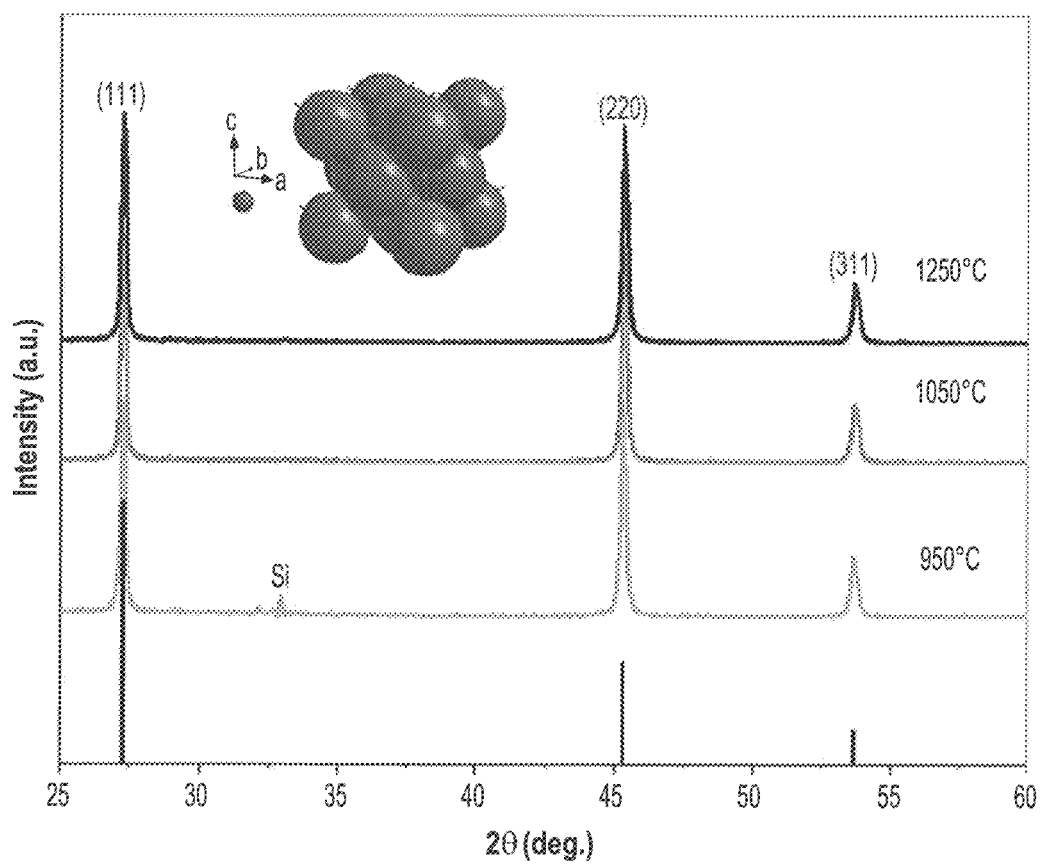
FIG. 5 depicts X-ray diffraction (XRD) results of germanium nanostructures prepared at various temperatures corresponding to those in FIGS. 4A-4D and vacuum of $10^{-5}$ mbar.
Figure 6:
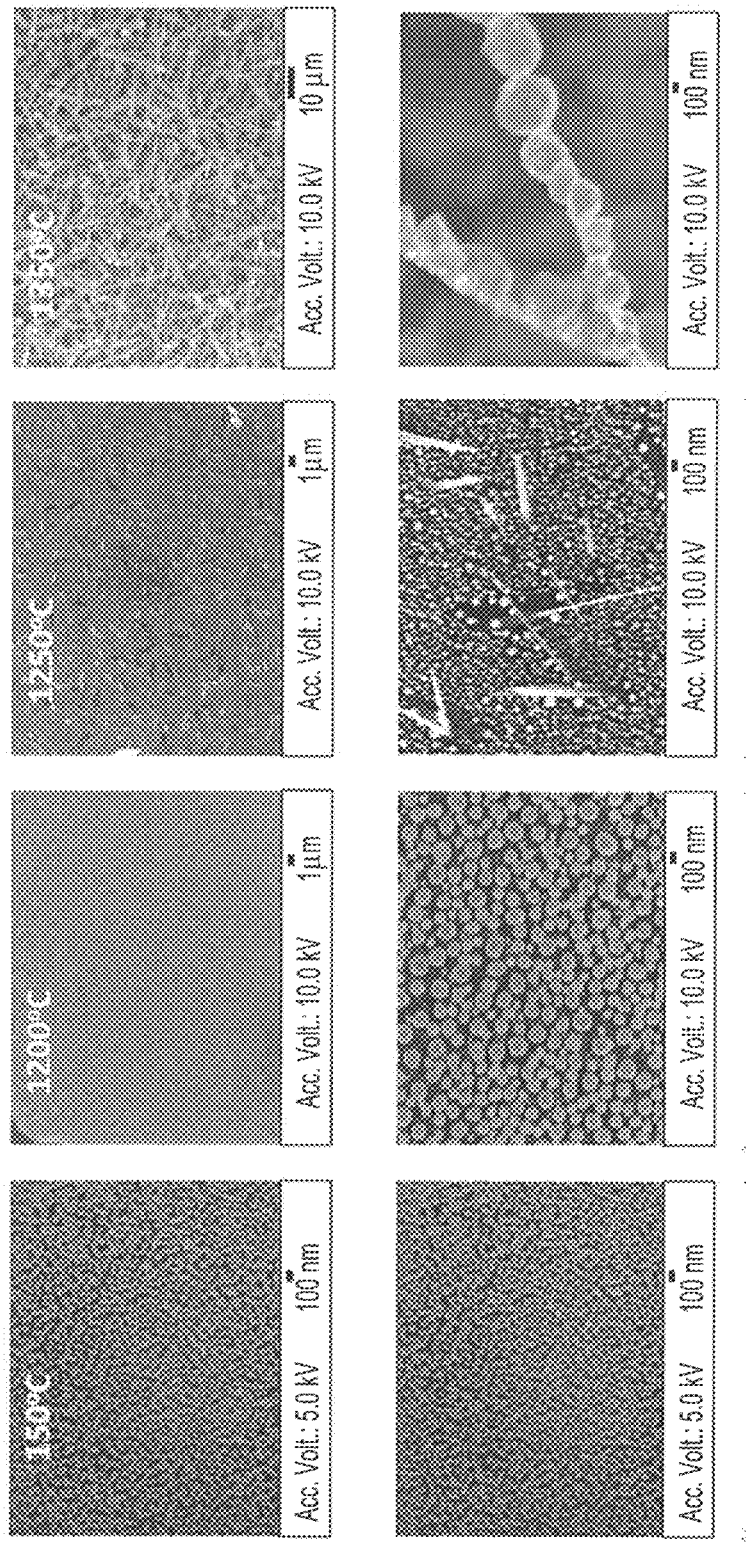
FIGS. 6A-6D depict SEM images of gold nanostructures prepared at various temperatures of (A) 1150° C., (B) 1200° C., (C) 1250° C. and (D) 1350° C. and vacuum of $10^{-5}$ mbar according to the present application.

FIG. 5 shows the XRD patterns for the fabricated Ge nanostructures. Three peaks are observed for the recorded data. The planes of these peaks are (111), (220), and (311), which are indexed on face-centered cubic of Ge of JCPDS card No 04-0545. The calculated lattice parameters are listed in Table 2.

TABLE 2 lattice parameter for Ge nanostructures

| Common name | Germanium |
|---|---|
| Structural formula | Ge |

| Phase data | |
|---|---|
| Formula weight | 72.640 g/mol |
| Crystal system | Cubic (f.c.c.) |
| Space-group | Fd3m (227) |
| Cell parameters | a = 5.6589(7) Å |
| Cell volume | 181.21(3) Å$^3$ |
| Calc. density | 5.324902 g/cm$^3$ |

| Atomic parameters | | | | | |
|---|---|---|---|---|---|
| Atom | Ox. | x/a | y/b | z/c | B[Å$^2$] | U [Å$^2$] |
| Ge | 0.00 | 0.000 | 0.000 | 0.000 | 2.25(1) | 0.027(1) |

FIGS. 6A-6D show SEM images for the fabricated Au nanostructures at temperatures of 1150° C., 1200° C., 1250° C. and 1350° C., as described below and in Table 3. At a temperature of 1150° C., nanoparticles were formed with a size of 50 nm. The size of particles increased to 90 nm with increasing temperature to 1200° C. The dimensionality of the Au nanostructures formed began to change when the temperature rose to 1250° C. Some nanowires were obtained at an evaporation temperature of 1250° C. with 70 nm in diameter and 500 nm in length. The nanowires were formed substantially parallel with the substrate surface. Nanowires with a heterostructure shown in the lower FIG. 6D image became dominated when formed at a high temperature of 1350° C. The nanowires had a fairly uniform length of about 10 μm. According to the FESEM image, the diameters of the nanowires ranged from 60-80 nm and appeared to be decorated on their surfaces by nanoparticles with an average size of around 160

TABLE 3

Au preparation conditions

| Source temp (°C.) | Substrate temp (°C.) | Pressure (mbar) | Time (min) | Source amount (mg) | Morphology | Size (nm) |
|---|---|---|---|---|---|---|
| 1150 | 280 | 10$^{-5}$ | 30 | 10 | NPs | 50 |
| 1200 | 330 | | | | NPs | 90 |
| 1250 | 380 | | | | NPs | 70 |
| 1350 | 420 | | | | NPs/NWs | 150/60 |

Figure 7:
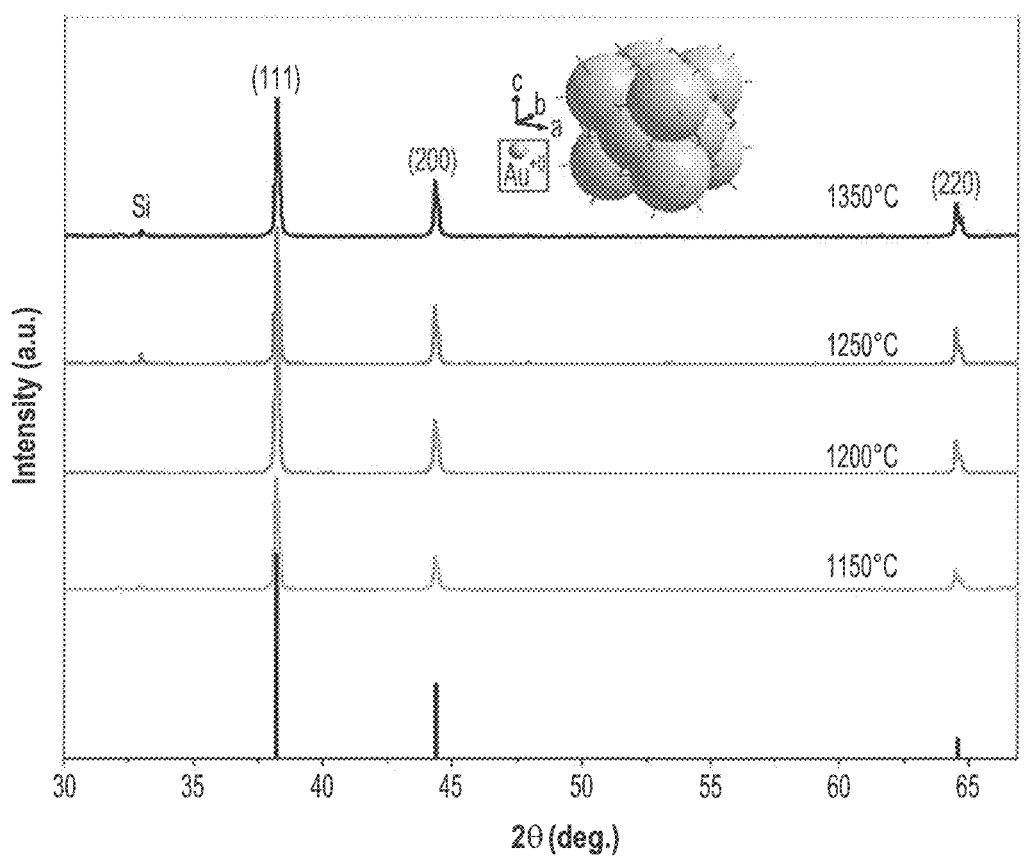
FIG. 7 depicts X-ray diffraction (XRD) results of gold nanostructures prepared at various temperatures corresponding to those in FIGS. 6A-6D and vacuum of $10^{-5}$ mbar.

FIG. 7 shows XRD patterns for Au nanostructures. Three peaks with different intensities of every Au nanostructure are shown. By using Retvield crystallographic program, the crystal structure was analyzed, and these peaks were identified as face centered cubic (f.c.c.) of Au crystal structure with Fm3mspace group and planes (111), (200) and (220), respectively. Table 4 shows the calculated lattice parameters for the fabricated nanostructures.

TABLE 4

Lattice parameter for Au nanostructures

| Common name | Gold |
|---|---|
| Structural formula | Au |

| Phase data | |
|---|---|
| Formula weight | 196.96 g/mol |
| Crystal system | cubic (f.c.c.) |

TABLE 4-continued

Lattice parameter for Au nanostructures

| Space-group | Fm3m (225) |
|---|---|
| Cell parameters | a = 4.0807(1) Å |
| Cell volume | 67.955(3) Å$^3$ |
| Calc. density | 19.25199 g/cm$^3$ |

| Atomic parameters | | | | | | |
|---|---|---|---|---|---|---|
| Atom | Ox. | x/a | y/b | z/c | B[Å$^2$] | U [Å$^2$] |
| Au | 0.00 | 0.000 | 0.000 | 0.000 | 3.8(2) | 0.048(6) |

FIGS. 8A-8B show the SEM image of Al nanostructures prepared according to the conditions of Table 5. Al nanostructure was prepared at 850° C. SEM images show the Al nanostructures fabricated by the present method include Al nanorods with a diameter of 100 nm and length of 1 μm.

TABLE 5

Al preparation conditions

| Source temp (°C.) | Substrate temp (°C.) | Pressure (mbar) | Time (min) | Source amount (mg) | Morphology | Size (nm) |
|---|---|---|---|---|---|---|
| 850 | 210 | 10$^{-5}$ | 30 | 10 | NRs | 100 |

FIG. 9 shows the XRD patterns for the fabricated Al nanorods. Three peaks with different intensities of the Al nanostructures are shown. By using a Retvield crystallographic program, the crystal structure was analyzed, and these peaks were identified as face centered cubic (f.c.c.) of Al crystal structure with Fm3mspace group and planes (111), (200) and (233), respectively. Table 6 shows the calculated lattice parameters for the fabricated nanostructures.

TABLE 6 lattice parameter for Al nanostructures

| Common name | Aluminum |
|---|---|
| Structural formula | Al |

| Phase data | |
|---|---|
| Formula weight | 26.982 g/mol |
| Crystal system | cubic (f.c.c.) |
| Space-group | Fm3m (225) |
| Cell parameters | a = 4.0849 Å |
| Cell volume | 68.162 Å$^3$ |
| Calc. density | ----- g/cm$^3$ |

Considering the Ge and Al nanostructures and data of Tables 1 and 5, growth of different nanostructures may depend on the substrate temperature, $T_s$, relative to the melting temperature of the source material, $T_m$. In the exemplary implementations discussed above, $T_m$ is 1064.18° C., 938.25° C. and 660.32° C. for Au, Ge and Al, respectively. The substrate temperature should range between $T_m/2$ and $T_m/4$, in an embodiment, to produce a resulting nanostructure growth. The substrate temperatures tested were 280° C., 330° C., 380° C. and 420° C. for the Au nanostructures formed (where $T_m/4$=266.05° C. and $T_m/2$=532.09° C.); 240° C., 270° C. and 380° C. for the Ge nanostructures formed (where $T_m/4$=234.56° C. and $T_m/2$=469.13° C.); and 210° C. for the Al nanostructures formed (where $T_m/4$=125.08° C. and $T_m/2$=330.16° C.). For example, when $T_s/T_m$=0.28>0.25, the energy for growing the 1D is not sufficient, and small nanoparticles are grown from limited neighbor nucleant sites. Increasing the substrate temperature may slightly increase the mobility of nuclei, which combine to become larger nanoparticles. Since $0.25<T_s/T_m=0.34$ or $0.39<0.5$ at the temperatures tested, some particles condense for a short time to form droplets on the substrate and become nuclei for 1D growth. The present methods and apparatus would be expected to work for materials other than the presently tested Au, Ge and Al. In particular, other metals including, e.g., Cr, Fe, Co. Ni, Cu, Zn, Cd, Sn, Ti, should be potentially usable in the present method.

It is to be understood that the present method and apparatus are not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. A method for forming nanostructures comprising the steps of:
   providing an apparatus for forming nanostructures from a source material, the apparatus comprising:
   a) a vacuum chamber;
   b) a double crucible container within the vacuum chamber, the double crucible container including:
      i) an outer crucible having a bottom wall, an upright peripheral wall extending from the bottom wall and forming a lip at an upper end thereof, an open top end opposite the bottom wall, and an inner cavity,
      ii) an inner crucible disposed within the inner cavity of the outer crucible, the inner crucible including a bottom wall, an upright peripheral wall extending from the bottom wall and forming a lip at an upper end thereof, an open top end opposite the bottom wall, and an inner cavity for receiving a source material, the lip of the inner crucible being configured to support a substrate over the open top end of the inner crucible, and
      iii) a resistive heating element extending between the outer crucible and the inner crucible, the heating element configured to surround an outer surface of the peripheral wall of the inner crucible
   placing an amount of source material in the cavity of the inner crucible of the apparatus, the source material having a melting temperature, wherein the source material is selected from the group consisting of Au, Ge, Al Cr, Fe, Co, Ni, Cu, Zn, Cd, Sn, and Ti;
   placing the substrate over the open end of the inner crucible to form a seal with the lip structure of the inner crucible;
   applying a vacuum to the vacuum chamber;
   raising a temperature of the source material to an evaporation temperature and a temperature of the substrate to a substrate temperature over a first period of time;
   maintaining the source material at the evaporation temperature and the substrate at a substrate temperature for a second period of time;
   forming nanostructures on the substrate; and
   allowing the source material to cool to room temperature.

2. The method of claim 1, wherein a vacuum pressure of the vacuum ranges from about 10-4 mbar to about 10-6 mbar.

3. The method of claim 1, wherein the evaporation temperature ranges from about 850° C. to about 1350° C.

4. The method of claim 1, wherein the source material is Au.

5. The method of claim 4, wherein the evaporation temperature ranges from about 1100° C. to about 1300° C. and the nanostructures comprise nanoparticles having a diameter ranging from about 50 nm to about 100 nm.

6. The method of claim 4, wherein the evaporation temperature is about 1350° C. and the nanostructures comprise nanoparticles having a diameter ranging from about 100 nm to about 200 nm and nanowires having a diameter that is less than about 100 nm.

7. The method of claim 1, wherein the source material is Ge.

8. The method of claim 7, wherein the evaporation temperature ranges from about 900° C. to about 1150° C. and the nanostructures comprise nanowires having a diameter ranging from about 500 nm to about 1000 nm.

9. The method of claim 7, wherein the evaporation temperature ranges from about 1200° C. to about 1300° C. and the nanostructures comprise nanowires having a diameter less than about 200 nm.

10. The method of claim 1, wherein the source material is Al.

11. The method of claim 10, wherein the evaporation temperature ranges from about 800° C. to about 900° C. and the nanostructures comprise nanowires having a diameter ranging from about 50 nm to about 150 nm.

12. The method of claim 1, wherein the source material is a powder or grain having a diameter less than 2 mm on average.

13. The method of claim 1, wherein the amount of source material ranges from about 3 mg to about 15 mg.

14. The method of claim 1, wherein the substrate comprises silicon.

* * * * *